United States Patent [19]
Sommerkamp

[11] 3,984,088
[45] Oct. 5, 1976

[54] VAPORIZING CRUCIBLE FOR VACUUM VAPOR COATING SYSTEMS

[75] Inventor: Peter Sommerkamp, Hanau am Main, Germany

[73] Assignee: Leybold-Heraeus GmbH & Co. KG, Cologne, Germany

[22] Filed: Oct. 6, 1975

[21] Appl. No.: 620,073

[30] Foreign Application Priority Data
Oct. 16, 1974 Germany............................ 2449225

[52] U.S. Cl................................. 266/275; 118/48; 219/121 EB
[51] Int. Cl.² ........................................ C23C 13/12
[58] Field of Search .............................. 118/48–49.5; 219/275, 272; 338/316, 224, 114; 13/35; 432/156, 262; 266/39

[56] References Cited
UNITED STATES PATENTS

| | | | |
|---|---|---|---|
| 3,227,431 | 1/1966 | Steeves .............................. | 118/48 X |
| 3,514,575 | 5/1970 | Hall et al. ............................ | 219/275 |
| 3,598,384 | 8/1971 | Zucchinelli ......................... | 266/39 |
| 3,863,907 | 2/1975 | Pierson et al. ..................... | 266/34 R |

FOREIGN PATENTS OR APPLICATIONS
1,276,421   8/1968   Germany ............................. 266/39

*Primary Examiner*—Morris Kaplan
*Attorney, Agent, or Firm*—Burgess, Dinklage & Sprung

[57] ABSTRACT

A vaporizing crucible for vapor depositing systems, especially for electron beam heating, includes a plurality of side-by-side segments held in contact with one another by an adjustable compression device. The individual segments have between them layers of a resilient, electrically conductive material which forms a joint between adjacent segments. The segments are surrounded by a frame in which the adjustable compression device is positioned for the transfer of current and compressing the segments. A layer of resilient conductive material can also be positioned between the compression device and the lateral surfaces of the segments, extending perpendicular to the joints. The frame can also include a hollow base on which the segments rest. A layer of resilient, electrically conductive material can be positioned between the segments and the hollow base.

4 Claims, 2 Drawing Figures

VAPORIZING CRUCIBLE FOR VACUUM VAPOR COATING SYSTEMS

BACKGROUND

The invention relates to a vaporizing crucible for vacuum vapor coating systems, especially for electron beam heating, consisting of a plurality of segments which are assembled and held together in contact with one another by pressure plates.

A vaporizing crucible of the kind initially described, for heating by the passage of electrical current, is known through German Pat. No. 1,276,421. In this crucible the object was to join together a relatively large number of segments to produce a crucible of great length to make possible the vapor coating of the entire width of, for example, moving bands of material. In the operation of vaporizing crucibles of this kind, however, it has been found that unacceptably high electrical contact resistances develop at the joints, resulting in a local overheating of the crucible material in those areas. This results in a premature end of the useful life of the crucible. Moreover, it has been observed that unequal temperature distribution over the entire length of the crucible produces relative displacements of the segments in relation to one another. The reason for this is probably temperature differences which occur during the heating operation, and differences in thermal balance over the full length of the crucible, which in turn are caused by uneven heating over the length of the crucible and varying heat losses due to radiation at different points on the crucible, which are difficult to control. As a result, a constant friction occurs at the confronting faces of the crucible segments, producing an attrition of the crucible material with a simultaneous relaxation of the contact pressure between them. The problem of contact resistance at the joints between the segments occurs, of course, only when the segments consist of a material which by nature is electrically conductive, or of a refractory material which has been made electrically conductive by means of special additives. In this case the train of segments is clamped between electrical contacts and raised to the required vaporization temperature by the direct passage of electrical current through it.

In the case of vaporization crucibles heated by electron beams the contact resistance between the segments is of no importance as far as heating is concerned. Vaporizing crucibles for electron beam heating have hitherto been made always in one piece, it being necessary, when crucible material is used which has a poor electrical conductivity in the cold state, to provide for the removal of the charged particles so as to enable the vaporization to be performed continuously. If the crucible material is insufficiently conductive, the buildup of an electrostatic charge on the content of the crucible would reflect the electrons, so that, under certain circumstances, controlled heating becomes impossible. An attempt has been made to solve this problem by drilling holes in the floor of the crucible and providing a grounding wire threaded meander-wise through the holes for the purpose of grounding the contents of the crucible. This method, however, resulted either in the melting of the wire and the interruption of the circuit, or in a leakage of the vaporized material through the holes, and in an undesirable chilling of the crucible content by the contact thus produced between it and the necessary water-cooled support on which it is mounted. Furthermore, the material being vaporized is converted by the metal of the grounding wire to an alloy which may have undesirable characteristics.

In addition to the electrical problems, however, the negative effects of differences in the thermal expansion of the individual segments still persist, especially in the case of electron beam heating, inasmuch as in this case much greater temperature gradients occur than in resistance-heated crucibles. That is, the power is applied at the focal point, so that temperatures are produced locally which are 2 to 3 times as high as the temperatures on the outside surface of the crucible. Furthermore, in the case of the electron beam heating of vaporizing crucibles it is difficult to prevent stray electrons or reflected electrons from impinging upon the crucible material, producing a very intense additional heating of the crucible material in the area of such impingement. For the reasons given above, the previously known segmented crucible is unreliable both when nonconductive materials are used and when conductive materials are used. Furthermore, due to the heat capacity and the poor thermal conductivity of the ceramic material, when the apparatus is opened to the outside atmosphere for charging. a thermal shock is produced which results in severe tensions in the material and hence in cracking.

THE INVENTION

The invention, therefore, is addressed to the problem of improving the initially described crucible construction such that, on the one hand, an electrically conductive connection will be assured between the contents of the crucible and the external surface of the crucible, and on the other hand the consequences of the different thermal expansions of the individual crucible segments will be less severe.

The common solution of both problems is achieved by the present invention in the vaporizing crucible described in the beginning, by the fact that gaskets of a resilient, electrically conductive material are located in the joints between the segments, and that the segments are surrounded by a frame containing the adjustable compression means for the transfer of the electric current and the pressing together of the segments.

By this method the following advantages are obtained: the resilient, electrically conductive material produces a perfect seal between the individual segments of the crucible, so that the leakage of the contents of the crucible is not possible. At the same time the gasket produces the electrical connection between the crucible contents and an electrical contact on the exterior of the crucible. Furthermore, it permits a relative movement of the individual segments against one another under the influence of varying thermal expansion without thereby producing any rubbing between the crucible segments, and the thermal tensions are completely and harmlessly dissipated within the joints. The quality of the surfaces in the joints does not have to meet particularly exacting requirements, since the resilient material completely compensates for any unevenness. The use of grounding wires can be entirely dispensed with, and thus all perturbances caused by the melting away of the grounding wires and/or the formation of alloys between the grounding wires and the metal being vaporized are eliminated. Experience has shown that the life of the vaporizing crucibles is increased by a factor of 10 by the use of the invention.

Graphite felt is preferred as the resilient, electrically conductive material. It is not necessary that the material of which the segments are made by itself electrically conductive unless the segments or train of segments are to be heated by the direct passage of electric current through them. Silicon dioxide and aluminum oxide, for example, can be used as materials, mixed together in some cases — hence, materials which are non-conductors in the cold state.

U.S. Pat. No. 3,277,431 discloses the placement of a stratum of graphite wool between the actual vaporizing crucible and a body enveloping the latter. This, however, is done for the express purpose of thermal insulating. The crucible body itself is not divided, i.e., it does not have any joints which are filled with graphite wool.

An especially advantageous embodiment of the invention is characterized by the fact that, at the lateral surfaces of the segments extending perpendicularly to the joints, compression means are provided in the frame with the interposition of resilient, electrically conductive material between such means and said segment surfaces. In this manner, contact is improved between the compression means and the edges of the resilient, electrically conductive material disposed in the joints.

In further improvement of the subject matter of the invention, the frame is provided with a base on which the segments lie with a resilient, electrically conductive material interposed. In this case the weight of the crucible or crucible segments, as the case may be, serves to improve the electrical contact.

DESCRIPTION OF THE DRAWING

An example of the embodiment of the invention will now be described, with reference to FIGS. 1 and 2.

In FIG. 1, 10 designates a vaporizing crucible made of a ceramic material such as silicon dioxide, and consisting of four segments 11 of identical length, height and width, and having a U-shaped cross-sectional profile. The U-shaped cross-sectional profile forms a trough 12 whose bottom is flat and whose walls 14 diverge slightly upwardly from the bottom (see also FIG. 2). The trough 12 is open at the two end faces of each segment 11, so that placing segments 11 end to end establishes a continuous trough to accommodate the material being vaporized. The series of segments 11 and the trough which they form is terminated at each end of vaporizing crucible 10 by an end block 15 of the same height and width as the U-shaped segments.

Figure 1:
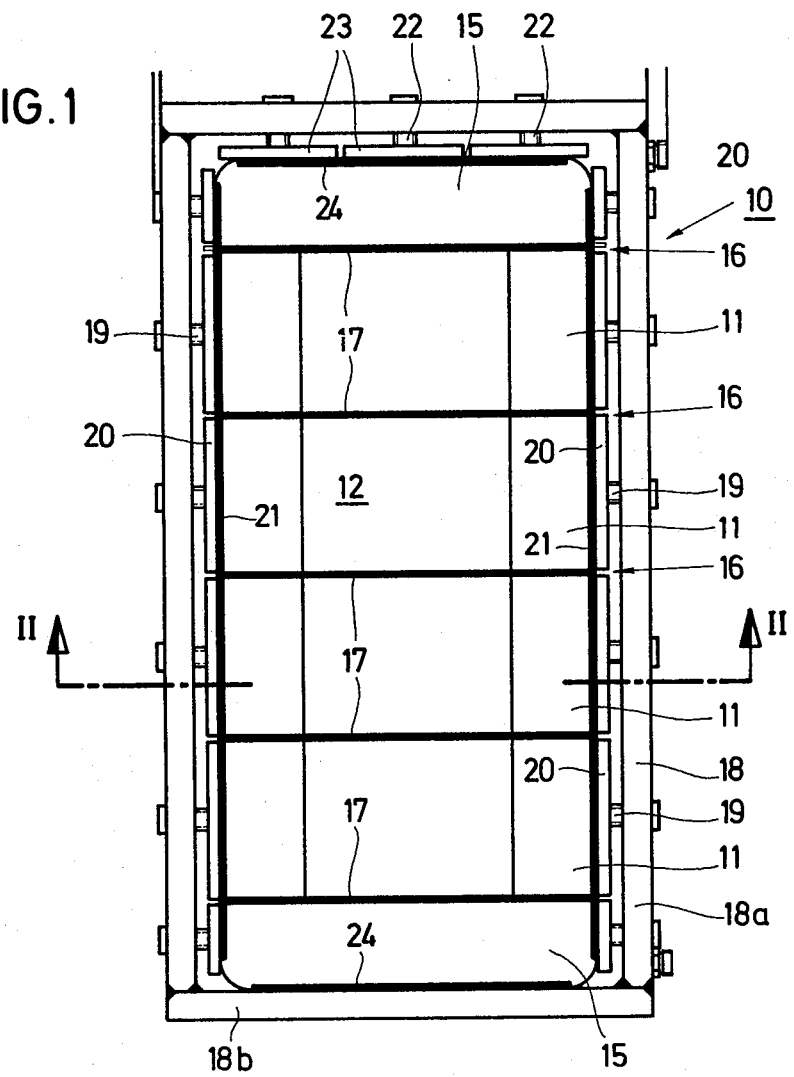
FIG. 1 is a top plan view of a complete vaporizing crucible.

Between the segments 11 and the end blocks 15 are the joints 14 in which there are placed gaskets of resilient, electrically conductive material 17, whose shape matches that of the end faces of the individual segments 11. This material not only provides the necessary seal between the segments and between the end blocks and their adjacent segments but also produces the electrically conductive connection between the interior and the exterior of the crucible, and allows for the different thermal expansions of the segments in relation to one another and to the end blocks 15.

The segments 11 and end blocks 15 together form a trough whose length can be made as long as desired by fitting together the required number of segments.

The assembly of segments and end blocks is surrounded on its outer periphery by a frame 18 composed of two long members 18a and two shorter members 18b. These members are assembled together by welding. In frame 18 a plurality of threaded holes are provided, one approximately in the center of each lateral face of each segment 11 and each end block 15. Into these holes are threaded spindles 19 each bearing a pad 20 on its extremity within the frame, the shape and size of said pad corresponding to the confronting surface of the particular segment or end block. Between the pads 20 and the segments 11 or end blocks 15 there is placed a continuous strip of resilient, electrically conductive material 21 which is in contact with the outer edges of the resilient, electrically conductive gaskets 17. The contact pressure is provided by means of the above-mentioned pads 20. In the shorter sides 18b of frame 18, spindles 22 with pads 23 are also provided at one end, which press the end blocks 15 and segments 11 sealingly together against one another and against the resilient, electrically conductive material 17 between them. Here, too, a piece of resilient, electrically conductive material 24 is interposed between pads 23 and end blocks 15. In the opposite shorter member 18b neither spindles nor pads are provided, so that the end block 15 engages frame 18 only with the interposition of a strip of resilient, electrically conductive material 24.

Figure 2:
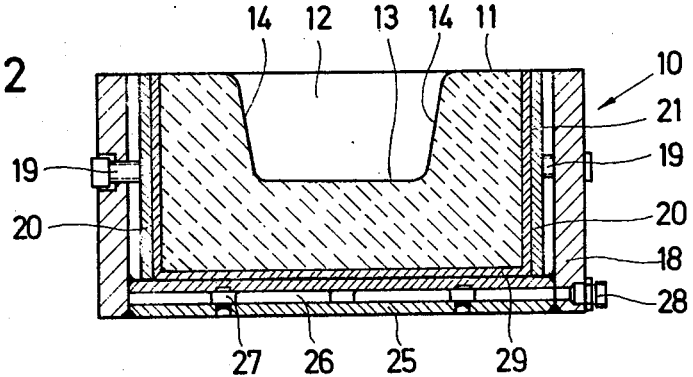
FIG. 2 is a cross-sectional view taken through the crucible of FIG. 1 along line II—II.

In FIG. 2, the parts identical to those of FIG. 1 are identified by the same reference numbers. It can be seen that the frame 18 includes a hollow base 25 underneath the bottom 13 of the segments 11, through whose cavity a coolant can be passed. This cavity 26 is spanned at more or less regular intervals by tension members 27 for the purpose of preventing the hollow base 25 from ballooning due to the difference between the coolant and the vacuum. A connection fitting 28 serves for the introduction of the coolant. Between the hollow base 25 and the bottom of the segments 11 there is also placed a sheet of resilient, electrically conductive material 29 on which the segments and end blocks rest substantially of their own weight. It can be seen that electrical currents are conducted from the interior of the recess 12 through the resilient, electrically conductive material 17, 21, 24 and 29 to the frame 18 and the hollow base 25. Thus, by grounding the frame 18 the charged electrical particles can be removed.

The vaporizing crucible of the invention is suitable for any kind of heating, such as for example heating by electrical arc or by induction, but especially for the bombardment of the material to be evaporated by electron beams.

What is claimed is:

1. Vaporizing crucible for vapor depositing installations, especially for electron beam heating, comprising a plurality of segments held in contact with one another by adjustable compression means, said segments having layers of a resilient, electrically conductive material located in the joints therebetween, said segments being surrounded by frame means in which said adjustable compression means are positioned for the transfer of current and compression of the segments.

2. Vaporizing crucible of claim 1 wherein graphite felt is used as the resilient, electrically conductive material.

3. Vaporizing crucible of claim 1 wherein the layer of resilient, conductive material is positioned between the compression means and the lateral surfaces of the segments extending perpendicular to the joints.

4. Vaporizing crucible of claim 1 wherein the frame means includes a base on which the segments lie with the interposition of a layer of resilient, electrically conductive material.

* * * * *